US009424897B2

United States Patent
Kim et al.

(10) Patent No.: US 9,424,897 B2
(45) Date of Patent: Aug. 23, 2016

(54) EQUALIZER AND SEMICONDUCTOR MEMORY DEVICE INCLUDING THE SAME

(71) Applicant: Samsung Electronics Co., Ltd., Suwon-si (KR)

(72) Inventors: Dae-Hyun Kim, Hwaseong-si (KR); Seung-Jun Bae, Hwaseong-si (KR); Kyung-Soo Ha, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 41 days.

(21) Appl. No.: 14/165,990

(22) Filed: Jan. 28, 2014

(65) Prior Publication Data

US 2014/0219036 A1    Aug. 7, 2014

(30) Foreign Application Priority Data

Feb. 4, 2013    (KR) .................. 10-2013-0012608

(51) Int. Cl.
| | |
|---|---|
| *G11C 7/22* | (2006.01) |
| *H03K 19/003* | (2006.01) |
| *G11C 7/10* | (2006.01) |
| *H03K 19/094* | (2006.01) |

(52) U.S. Cl.
CPC .............. *G11C 7/22* (2013.01); *G11C 7/1048* (2013.01); *G11C 7/1057* (2013.01); *H03K 19/00361* (2013.01); *H03K 19/09429* (2013.01)

(58) Field of Classification Search
CPC .................................. G11C 7/12; G11C 7/22
USPC ........................................ 365/189.02, 189.11
See application file for complete search history.

(56) References Cited

U.S. PATENT DOCUMENTS

| | | | |
|---|---|---|---|
| 5,726,587 A | 3/1998 | Ratner | |
| 6,366,123 B1* | 4/2002 | Liu | H03K 3/356121 326/56 |
| 6,515,885 B1* | 2/2003 | Casper | G11C 8/06 365/230.08 |
| 7,158,432 B1 | 1/2007 | Hunter et al. | |
| 8,390,317 B2 | 3/2013 | Bae et al. | |
| 2006/0139079 A1* | 6/2006 | Onodera | H03K 5/15066 327/261 |
| 2011/0026334 A1* | 2/2011 | Bae | G11C 7/1051 365/189.11 |

FOREIGN PATENT DOCUMENTS

| | | |
|---|---|---|
| JP | 2005-339590 | 12/2005 |
| KR | 10-2004-0002015 A | 1/2004 |
| KR | 10-2011-0012805 A | 2/2011 |

* cited by examiner

*Primary Examiner* — Hoai V Ho
*Assistant Examiner* — Muna A Techane
(74) *Attorney, Agent, or Firm* — Muir Patent Law, PLLC

(57) ABSTRACT

Provided are an equalizer and a semiconductor memory device including the same. The equalizer includes a delay circuit and an inverting circuit. The delay circuit is configured to output, in response to a select signal, one of a delay signal delaying an input signal applied to an input/output node and an inverted signal inverting the input signal. The inverting circuit is configured to invert a signal provided from the delay circuit and output the inverted signal to the input/output node. The equalizer is configured such that when the delay circuit outputs the delay signal, the equalizer operates as an inductive bias circuit amplifying the input signal and outputting the amplified input signal, and when the delay circuit outputs the inverted signal, the equalizer operates as a latch circuit storing and outputting the input signal.

15 Claims, 12 Drawing Sheets

EQUALIZER AND SEMICONDUCTOR MEMORY DEVICE INCLUDING THE SAME

CROSS-REFERENCE TO RELATED APPLICATIONS

This application claims priority under 35 U.S.C. §119 to Korean Patent Application No. 10-2013-0012608, filed on Feb. 4, 2013, in the Korean Intellectual Property Office, the disclosure of which is incorporated herein in its entirety by reference.

BACKGROUND

This disclosure relates to an equalizer and a semiconductor memory device including the same, and more particularly, to an equalizer having a reduced layout area and a semiconductor memory device including the same.

A plurality of tri-state buffers for sequentially outputting data are used at an internal or external node of a semiconductor memory device, such as DRAM or flash memory. The plurality of tri-state buffers may have a high impedance state during an operation. As the plurality of tri-state buffers are in a high impedance state, when an output node floats, a semiconductor memory device may operate unstably. Moreover, when a semiconductor memory device operates at high speed, intersymbol interference (ISI) may occur in an output signal of a tri-state buffer.

SUMMARY

The disclosed embodiments provide an equalizer having a reduced layout area.

The disclosed embodiments provide a semiconductor memory device including the equalizer for stably and accurately outputting data.

According to one embodiment, there is provided an equalizer including a delay circuit and an inverting circuit. The delay circuit is configured to output, in response to a select signal, one of a delay signal delaying an input signal applied to an input/output node and an inverted signal inverting the input signal. The inverting circuit coupled to the delay circuit and configured to invert a signal provided from the delay circuit and output the inverted signal to the input/output node. The equalizer is configured such that when the delay circuit outputs the delay signal, the equalizer operates as an inductive bias circuit amplifying the input signal and outputting the amplified input signal, and when the delay circuit outputs the inverted signal, the equalizer operates as a latch circuit storing and outputting the input signal.

According to one embodiment, there is provided a semiconductor memory device including a multiplexer and an equalizer. The multiplexer includes a plurality of tri-state buffers and is configured to sequentially output a plurality of data signals corresponding to a respective plurality of data signals applied in parallel to the plurality of tri-state buffers. The equalizer includes an input/output node connected to an output node of the multiplexer, and is configured to operate as an inductive bias circuit amplifying the output signal of the multiplexer and outputting the amplified output signal, and to operate as a latch circuit storing and outputting an output signal of the multiplexer, in response to a select signal.

According to one embodiment, there is provided a memory device including a first and second driver circuits. The first driver circuit is configured to output one or more output signals on an output node of the first driver circuit or float the output node based on a first driver select signal. The second driver circuit is configured to amplify or store the one or more output signals in response to a second driver select signal, and to store the one or more output signals when the first driver circuit is deactivated.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
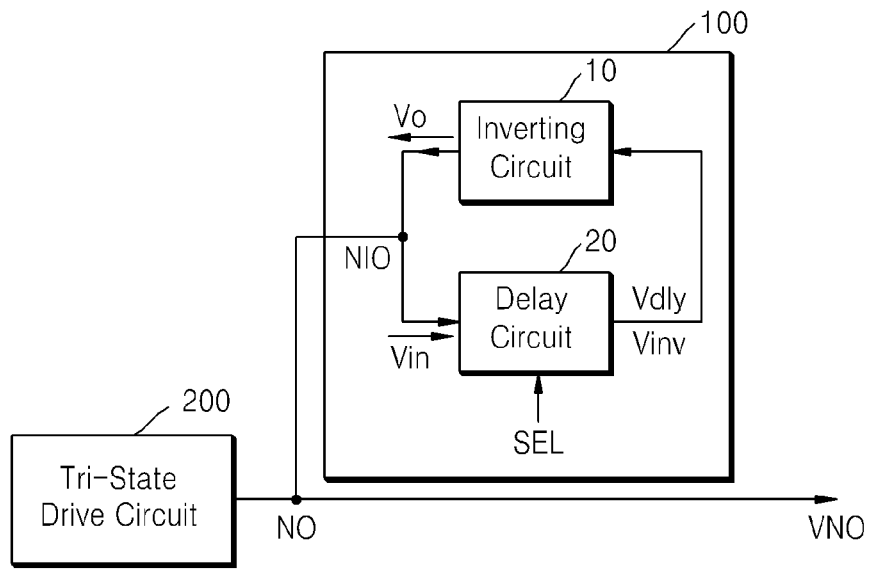
FIG. 1 is a block diagram of an equalizer according to exemplary embodiments.

Hereinafter, embodiments of the present disclosure will be described in more detail with reference to the accompanying drawings. The present disclosure may be embodied with many different modifications and thus may include several embodiments. Therefore, specific embodiments will be shown in the drawings and described in detail. However, it will be understood by those of ordinary skill in the art that various changes in form and details may be made therein without departing from the spirit and scope of the present invention as defined by the following claims. While each drawing is described, like reference numerals refer to like elements. In the accompanying drawings, the dimensions of layers and regions are exaggerated for clarity of illustration.

Terms used in this specification are used to describe specific embodiments, and are not intended to limit the scope of the present invention. A singular form used for the terms herein may include a plural form unless being clearly different from the context. In this specification, the meaning of "include", "comprise", "including", or "comprising," specifies a property, a region, a fixed number, a step, a process, an element and/or a component but does not exclude other properties, regions, fixed numbers, steps, processes, elements and/or components.

It will be understood that, although the terms first, second, etc. may be used herein to describe various elements, these elements should not be limited by these terms. Unless indicated otherwise, these terms are only used to distinguish one element from another. For example, a first element could be termed a second element, and, similarly, a second element could be termed a first element, without departing from the scope of the inventive concept.

Unless otherwise defined, all terms used herein include technical terms and scientific terms, and also have the same meanings that those of ordinary skill in the art commonly understand. Additionally, it should be understood that typically used terms defined in dictionaries have consistent meanings in related technical contents, and if not explicitly defined, should not be interpreted as being excessive formal meanings.

The embodiments will now be described more fully with reference to the accompanying drawings, in which embodiments of the inventive concept are shown.

FIG. 1 is a block diagram of an equalizer 100 according to exemplary embodiments.

Referring to FIG. 1, the equalizer 100 includes an inverting circuit 10 and a delay circuit 20, which are connected in parallel to each other, each one node end being connected to an input/output node NIO.

The inverting circuit 10 inverts an applied signal and then outputs the inverted signal to the input/output node NIO that it may be connected to externally or internally. An input node of the inverting circuit 10 may be connected to an output node of the delay circuit 20. Accordingly, when a signal applied from the delay circuit 20 is at a first level, the inverting circuit 10 converts the first level to a second level and outputs it. When a signal applied from the delay circuit 20 is at a second level, the inverting circuit 10 converts the second level to a first level and outputs it. At this point, the first level and the second level may vary according to a voltage applied to the equalizer 100. For example, once a power voltage and a ground voltage are applied to the equalizer 100, the first level is the ground voltage and the second level is the power voltage.

As the input signal Vin is applied to the input/output node NIO, in response to a select signal SEL, the delay circuit 20 may provide a delay signal Vdly by delaying the input signal Vin or an inverted signal Vinv by inverting the input signal Vin to the inverting circuit 10. For example, the input signal Vin may be a signal applied from the outside the equalizer to the input/output node NIO or a signal outputted from the inverting circuit 10. The select signal SEL may be set according to signal characteristics of the input signal Vin. For example, when the input signal Vin is a high frequency signal, the select signal SEL may be set to the first level, and when the input signal Vin is a low frequency signal, the select signal SEL may be set to the second level The delay signal Vdly has the same logic level as the input signal Vin. When the level of the input signal Vin is shifted, the delay signal Vdly is shifted to the same level as the input signal Vin, and is a signal having a shifted time that is delayed relative to the input signal Vin. The inverted signal Vinv has an opposite logic level to the input signal Vin. When the level of the input signal Vin is shifted, the inverted signal Vinv is shifted to an opposite level to the input signal Vin, and is a signal having a shifted time that is delayed relative to the input signal Vin.

The delay circuit 20 selectively outputs the delay signal Vdly or the inverted signal Vinv according to a logic level of the select signal SEL. For example, when the select signal SEL is at the first level, the delay circuit 20 outputs the delay signal Vdly, and when the select signal SEL is at the second level, the delay circuit 20 outputs the inverted signal Vinv.

When the delay circuit 20 outputs the delay signal Vdly, since the inverting circuit 10 inverts the delay signal Vdly and outputs the inverted signal, the equalizer 100 delays the input signal Vin and outputs the inverted signal almost simultaneously. Accordingly, the equalizer 100 may operate as an inductive bias circuit amplifying and outputting the high frequency component of the input signal Vin. On the contrary, when the delay circuit 20 outputs the inverted signal Vinv, since the inverting circuit 10 re-inverts the inverted signal Vinv and outputs the re-inverted signal, the equalizer 100 finally outputs a signal that delays the input signal Vin. Accordingly, the equalizer 100 may operate as a latch circuit storing and outputting the input signal Vin. Its detailed description is provided below with reference to FIGS. 3A to 4.

For example, referring to FIG. 1, the input/output node NIO of the equalizer 100 may be connected to an output node NO of a tri-state drive circuit 200. The tri-state drive circuit 200 may have a first state (e.g., a logic low level), a second state (e.g., a logic high level), and a high impedance state (e.g., floating state).

As a voltage of the output node NO of the tri-state drive circuit 200, an output voltage VNO transmitted to an external circuit (not shown) may be affected by the equalizer 100. When the equalizer 100 operates as an inductive bias circuit, the high frequency component of the output voltage VNO may be amplified due to inductive peaking. When the equalizer 100 operates as a latch circuit, it receives the output voltage VNO as the input signal Vin, and then, stores and outputs it. Accordingly, even when the tri-state drive circuit 200 outputs no signal in a high impedance state, an output voltage of a previous state of the tri-state drive circuit 200 is stored in the equalizer 100 and output, and thus, the output node NO does not float.

When the tri-state drive circuit 200 operates at high speed and outputs a high-frequency signal, as it drives a large load (for example, a load capacitor), Inter-symbol Interference (ISI) may occur. The ISI is a phenomenon in which when a rising time or a falling time of an output signal is longer than a period of a signal, as the output signal changes before a previously outputted signal is sufficiently stabilized, the waveform of the output signal is distorted. However, when the equalizer 100 operates as an inductive bias circuit, it amplifies the high frequency component of the output voltage VNO. Therefore, when the tri-state drive circuit 200 operates at high speed, since the equalizer 100 operates as an inductive bias circuit, the ISI may be prevented.

Moreover, when the tri-state drive circuit 200 operates at low speed or does not operate, as the equalizer 100 operates as a latch circuit, the output node NO may not float, and a stable output voltage VNO may be outputted.

As mentioned above, since the equalizer 100 of FIG. 1 operates as an equalizer or an inductive bias circuit according to an operating state of the tri-state drive circuit 200, a voltage that the tri-state drive circuit 200 requires may be outputted stably. Furthermore, since the equalizer 100 of FIG. 1 operates as an inductive bias circuit or a latch circuit in response to a select signal, its layout area may be further reduced than when the inductive biases circuit and the latch circuit are separately designed for layout.

Figure 2:
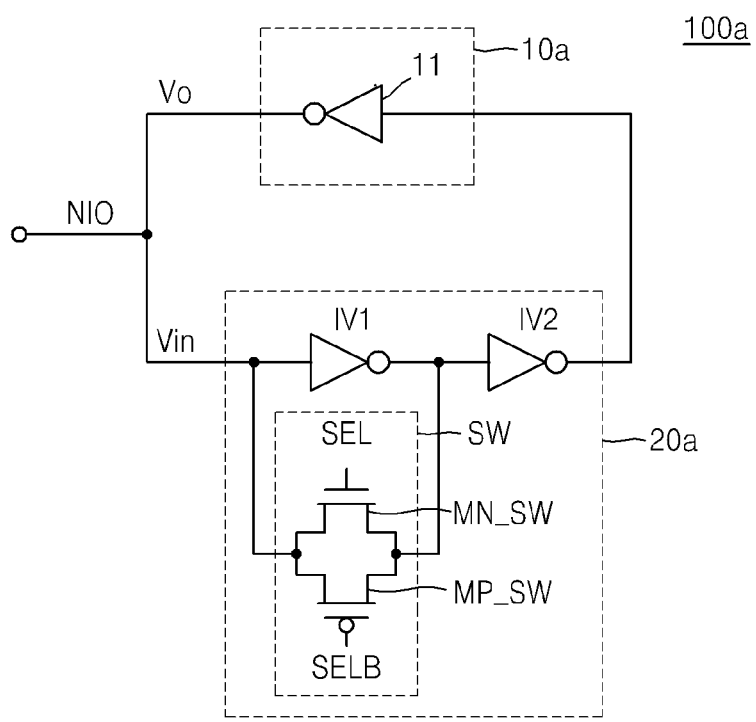
FIG. 2 is an exemplary circuit diagram illustrating the equalizer of FIG. 1 according to one embodiment.

FIG. 2 is an exemplary circuit diagram illustrating the equalizer 100 of FIG. 1 according to one embodiment.

Referring to FIG. 2, an equalizer 100a may include an inverting circuit 10a and a delay circuit 20a. For example, the inverting circuit 10a may include an inverter 11. The inverter 11 may invert and output an input signal. In one embodiment, one inverter 11 is included but the disclosure is not limited thereto. In another embodiment, the inverting circuit 10a may include an even number of additional inverters in addition to the inverter 11.

For example, the delay circuit 20a may include a plurality of inverters, namely, first and second inverters IV1 and IV2, connected in series between an input node and an output node and a switch SW connected in parallel to at least one inverter. For example, it is shown that the first inverter IV1 and the second inverter IV2 are connected in series and the switch SW is connected in parallel to the first inverter IV1.

The switch SW may be turned on or off in response to a select signal SEL. For example, the switch SW may be implemented with a transmission gate including a PMOS transistor MP_SW and an NMOS transistor MN_SW connected in parallel to each other, as shown in FIG. 2. The PMOS transistor MP_SW and the NMOS transistor MN_SW are turned on according to opposite voltage levels, so that the select signal SEL may be applied to a gate of the NMOS transistor NM_SW and a sub-select signal SELB may be applied to a gate of the PMOS transistor MP_SW. For example, the sub-select signal SELB may be applied from the outside together with the select signal SEL, or may be generated by inverting the select signal SEL applied from inside the circuit.

If the select signal SEL is at a first logic level, for example, a low level, since a low level signal is applied to the NMOS transistor MN_SW and a high level signal is applied to the PMOS transistor MP_SW, the switch SW is turned off. Accordingly, the first inverter IV1 outputs an inverted signal of an input signal Vin, and the second inverter W2 inverts the inverted signal again and outputs it. Since a time delay exists between an input and an output according to a response speed of an inverter, a delay signal where the input signal Vin is delayed by a predetermined time through the first inverter IV1 and the second inverter W2 is outputted.

If the select signal SEL is at a second logic level, for example, a high level, since a high level signal is applied to the NMOS transistor MN_SW and a low level signal is applied to the PMOS transistor MP_SW, the switch SW is turned on. Since the switch SW is connected in parallel to the first inverter IV1, the switch SW is turned on, so that the input node and output node of the first inverter IV1 are short. Accordingly, the input signal Vin is applied to the second inverter IV2 and is inverted by the second inverter IV2. Therefore, the delay circuit 20a may output an inverted signal of the input signal Vin.

As shown in FIG. 2, the delay circuit 20a may include two inverters, namely, the first and second inverters IV1 and IV2, and the switch SW that is connected in parallel to the first inverter IV1. This is just one example, and the present disclosure is not limited thereto. The delay circuit 20a may include one or more inverters. Also, when an even number of inverters operate, a delay signal may be outputted, and when an odd number of inverters operate, an inverted signal may be outputted. Accordingly, the number of inverters and a connection relationship with the switch SW may vary in order to operate an even number of inverters or an odd number of inverters in response to the select signal SEL.

Figure 3A:
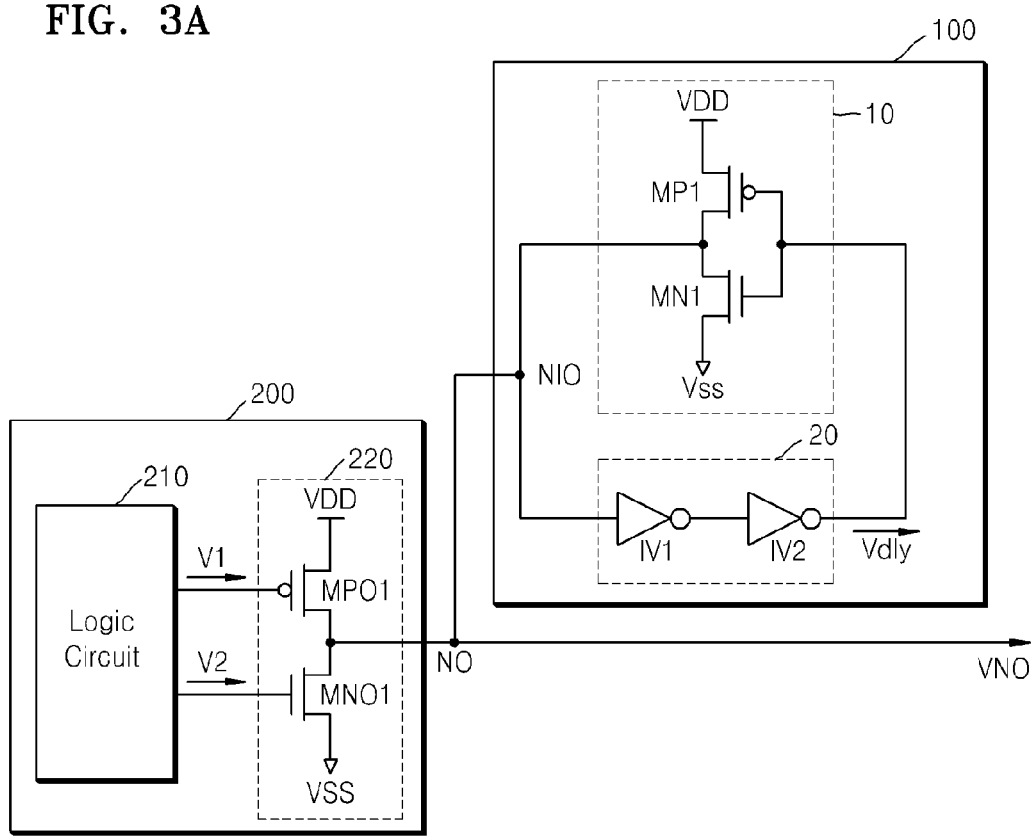
FIGS. 3A to 3D are an exemplary circuit diagram and timing diagram illustrating that the equalizer of FIG. 1 operates as an inductive bias circuit according to one embodiment.
Figure 3B:
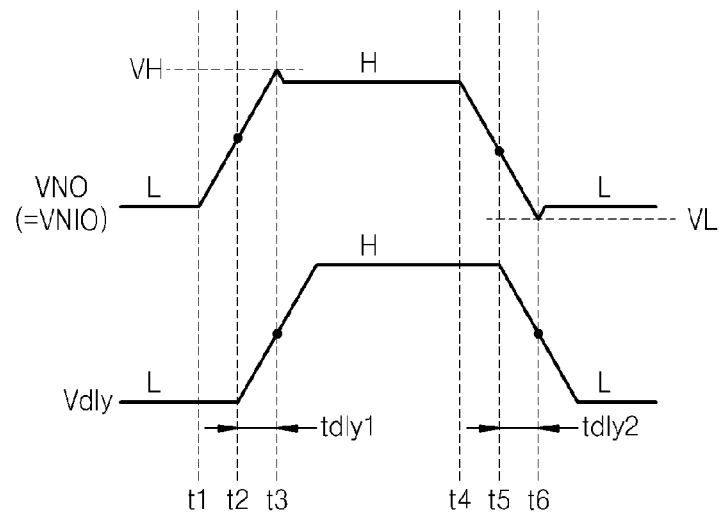

Hereafter, the case that the equalizer 100 of FIG. 1 operates as an inductive bias circuit will be described in more detail with reference to FIGS. 3A to 3D. FIG. 3A is an exemplary circuit diagram illustrating an equalizer 100 operating as an inductive bias circuit and a tri-state drive circuit 200. FIG. 3B is an exemplary timing diagram illustrating an operation of the equalizer 100. Additionally, FIGS. 3C and 3D are exemplary views qualitatively illustrating an inductive peaking operation of the equalizer 100.

Figure 3C:
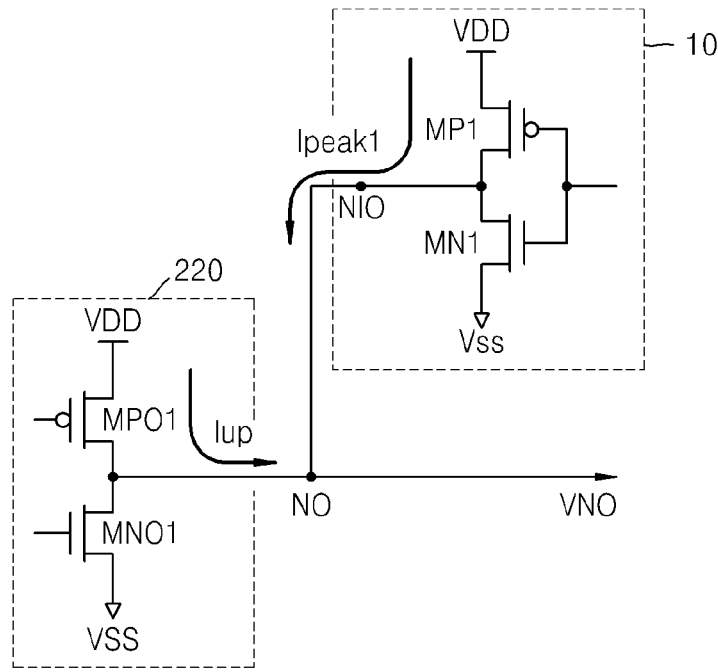
Figure 3D:
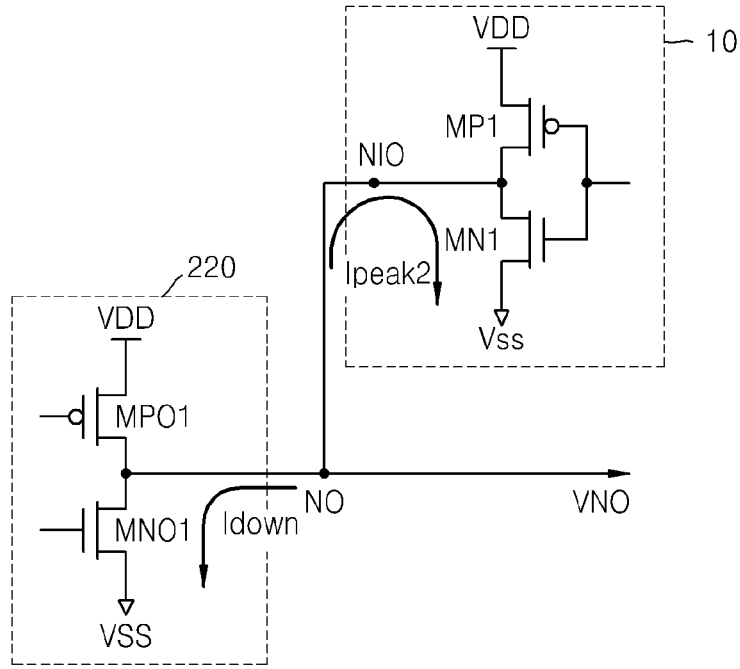

For a detailed description, as shown in FIG. 3A, an output circuit 220 (e.g., a tri-state driver circuit) of the tri-state drive circuit 200 and an inverting circuit 10 of the equalizer 100 are represented using an NMOS transistor and a PMOS transistor, and in FIGS. 3C and 3D, the inverting circuit 10 of the equalizer 100 and an output circuit 220 of the tri-state drive circuit 200 are only shown.

Referring to FIG. 3A, the tri-state drive circuit 200 may include a logic circuit 210 and an output circuit 220. The output circuit 220 may include a pull-up device MPO1 and a pull-down device MNO1. For example, the pull-up device MPO1 may be a PMOS transistor MPO1 connected between a power voltage VDD and the output node NO and having a gate to which a first signal V1 is inputted. For example, the pull-down device MNO1 may be an NMOS transistor MNO1 connected between a ground voltage VSS and the output node NO and having a gate to which a second signal V2 is inputted.

The first signal V1 and the second signal V2 are outputted from the logic circuit 210. The first signal V1 and the second signal V2 may be substantially the same signal. For example, each of the first signal V1 and the second signal V2 may be a signal for turning off the PMOS transistor MPO1 and the NMOS transistor MNO1. If the first signal V1 and the second signal V2 are at the same level, one of the PMOS transistor MPO1 and the NMOS transistor MNO1 is turned on, so that a relatively high level of the power voltage VDD or a relatively low level of the ground voltage VSS may be outputted. If the first signal V1 is a high level signal and the second signal V2 is a low level signal, the PMOS transistor MPO1 and the NMOS transistor MNO1 are both turned off, so that no signal is outputted. This state may be called a high impedance state.

The inverting circuit 10 of the equalizer 100 may include a pull-up device MP1 and a pull-down device MN1. For example, the pull-up device MP1 may be a PMOS transistor MP1 connected between the power voltage VDD and the input/output node NIO. For example, the pull-down device MN1 may be an NMOS transistor MN1 connected between the ground voltage VSS and the input/output node NIO. The same signal, for example, the delay signal Vdly outputted from the delay circuit 20, may be applied to gates of the PMOS transistor MP1 and the NMOS transistor MN1. For example, the delay circuit 20 may delay an input signal through an even number of inverters IV1 and IV2, and then, may provide the delayed input signal to the inverting circuit 10.

The input/output node NIO of the equalizer 100 and the output node NO of the tri-state drive circuit 200 may be the same node. The input/output node NIO and the output node NO may have the same voltage. The delay circuit 20 receives and delays an output of the tri-state drive circuit 200 and then outputs the delayed signal.

Referring to FIGS. 3A and 3B, when the first signal V1 and the second signal V2 are at a second level, for example, a high level, the PMOS transistor MPO1 of the output circuit 220 is turned off, and the NMOS transistor MNO1 of the output circuit 220 is turned on, so that the ground voltage VSS may be outputted. The ground voltage VSS may be a voltage corresponding to a low level. Accordingly, the voltage VNO of the output node NO and the delay signal Vdly outputted from the delay circuit 20 may be at a low level before the time t1. Then, when the first signal V1 and the second signal V2 are at a first level, for example, a low level, the NMOS transistor MNO1 of the output circuit 220 is turned off, and the PMOS transistor PNO1 of the output circuit 220 is turned on, so that the power voltage VDD may be outputted. The power voltage VDD may be a voltage corresponding to a high level. Therefore, the voltage VNO of the output node NO shifts from a low level to a high level. Moreover, when the delay signal Vdly also shifts from a low level to a high level, the shift time t3 may be delayed by a predetermined time tdly1 according to physical characteristics of the delay circuit 20, for example delay characteristics. While the voltage VNO of the output node NO shifts from a low level to a high level, the PMOS transistor MP1 of the inverting circuit 10 maintains a turn-on state from the shift start time t1 to the shift time t3 of the delay signal Vdly. Accordingly, as shown in FIG. 3C, in addition to a current Iup flowing from the power voltage VDD to the output node NO through the PMOS transistor MPO1 of the output circuit 220 in the tri-state drive circuit 200, an additional current Ipeak1 further flows through the PMOS transistor MP1 of the inverting circuit 10 in the equalizer 100. Therefore, the voltage VNO of the output node NO may rise fast by an inductive peaking operation, and may rise to the maximum output voltage VH of the output circuit 220. For example, the equalizer 100 may operate as a driver circuit by which an input signal applied to the driver circuit is amplified. After the shift time t3 of the delay signal Vdly, the NMOS transistor MN1 of the inverting circuit 10 is turned on. Therefore, the voltage VNO of the output node NO becomes lower than the maximum output voltage VH. The on-resistance of the PMOS transistor MPO1 of the output circuit 220 may be less than that of the NMOS transistor MN1 of the inverting circuit 10. Accordingly, in one embodiment, even when the voltage VNO of the output node NO is lower than the maximum output voltage VH, it is not lower than half of the maximum output voltage VH.

For example, when the first signal V1 and the second signal V2 shift from a second level, for example, a high level, to a low level, the PMOS transistor MPO1 of the output circuit 220 is turned off, and the NMOS transistor MNO1 of the output circuit 220 is turned on, so that the ground voltage VSS may be outputted. Therefore, the voltage VNO of the output node NO shifts from a high level to a low level. Moreover, when the delay signal Vdly also shifts from a high level to a low level, the shift time t6 may be delayed by a predetermined time tdly2 according to physical characteristics of the delay circuit 20, for example delay characteristics. The predetermined time tdly2 and tldy1 may be the same or different. While the voltage VNO of the output node NO shifts from a high level to a low level, the NMOS transistor MN1 of the inverting circuit 10 maintains a turn-on state from the shift start time t4 to the shift time t6 of the delay signal Vdly. Accordingly, as shown in FIG. 3D, in addition to a current Idown flowing from the output node NO to the ground voltage VSS through the NMOS transistor MNO1 of the output circuit 220 in the tri-state drive circuit 200, an additional current Ipeak2 further flows through the NMOS transistor MN1 of the inverting circuit 10 in the equalizer 100. Therefore, the voltage VNO of the output node NO may fall fast by an inductive peaking operation of the equalizer 100, and drops to the minimum output voltage VL of the output circuit 220.

After the shift time t6 of the delay signal Vdly, since the PMOS transistor MP1 of the inverting circuit 10 is turned on, the voltage of the output node NO becomes higher than the minimum output voltage VL.

As mentioned above, the equalizer 100 raises or drops the voltage VNO of the output node NO quickly by inductive peaking, thereby amplifying the high frequency component of the output voltage VNO. Accordingly, when a high frequency signal is outputted as the tri-state drive circuit 200 drives a large load, ISI may be prevented.

Figure 4:
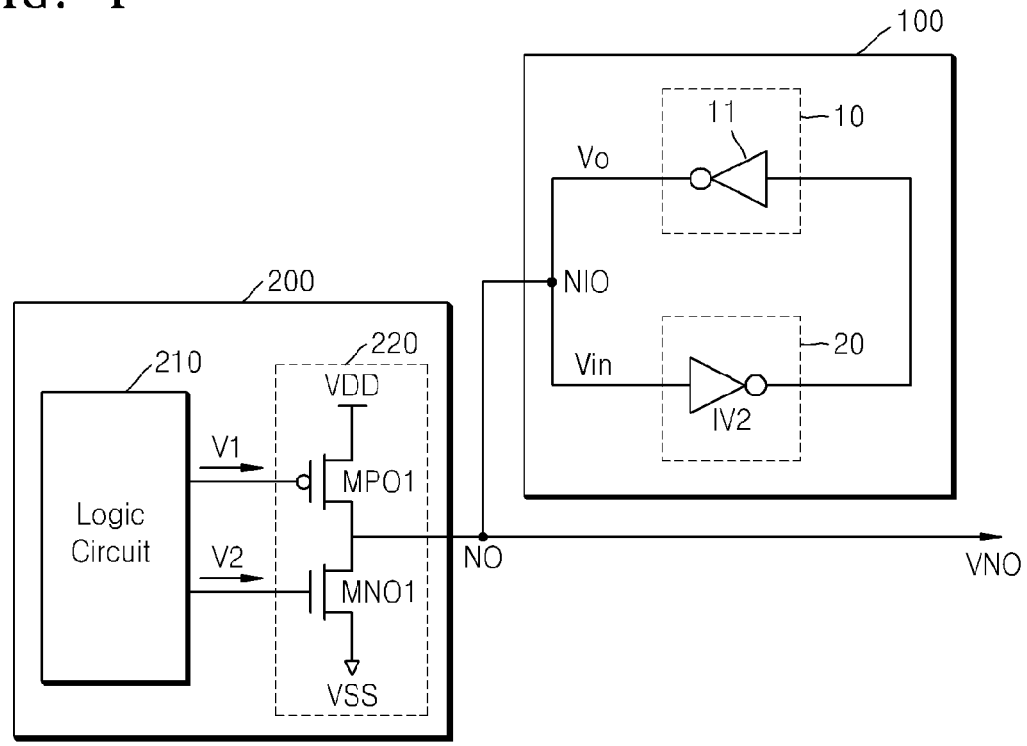
FIG. 4 is an exemplary circuit diagram illustrating that the equalizer of FIG. 1 operates as a latch circuit according to one embodiment.

FIG. 4 is an exemplary view illustrating that the equalizer 100 operates as a latch circuit according to one embodiment. As described with reference to FIG. 2, when the select signal SEL is at a second level, for example, a high level, the switch SW is turned on and the second inverter IV2 operates or an odd number of inverters operate. Therefore, an input signal Vin is inverted and outputted by the second inverter IV2. In relation to the inverting circuit 10 and the delay circuit 20, their input nodes and output nodes are cross connected to each other, and an inverting operation is performed, so that the equalizer 100 may operate as a latch circuit storing a received signal. Moreover, when the first signal V1 applied to the output circuit 220 of the tri-state drive circuit 200 is at a second level, for example, a high level, and the second signal V2 is at a first level, for example, a low level, the PMOS transistor MPO1 and the NMOS transistor NMO1 of the output circuit 220 are both turned off, so that the tri-state drive circuit 200 enters, for example, a high impedance High-Z state. Although there is no signal outputted from the tri-state drive circuit 200, since the equalizer 100 stores a signal previously outputted from the tri-state drive circuit 200 and outputs the stored signal, the output node NO does not float and maintains a previous signal.

Figure 5:
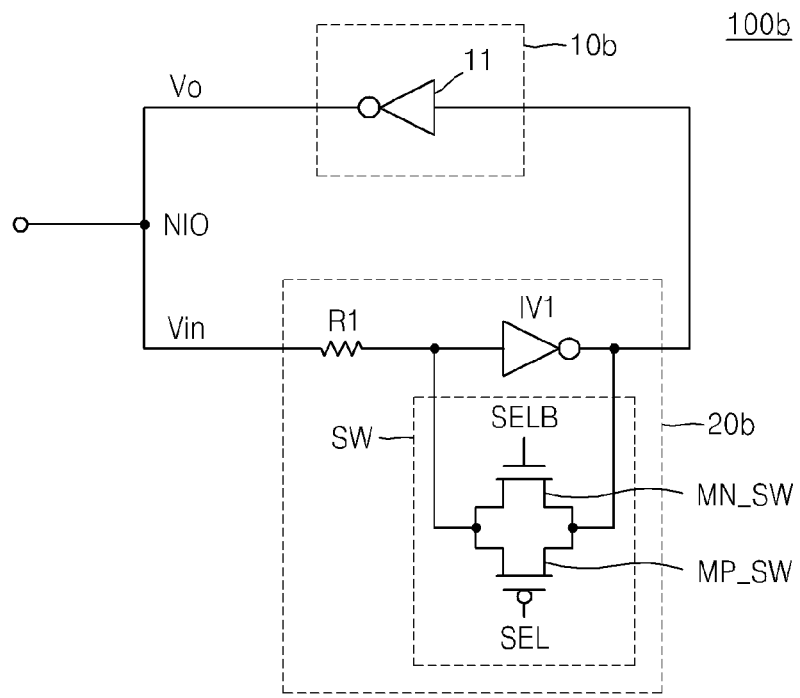
FIG. 5 is an exemplary circuit diagram illustrating the equalizer of FIG. 1 according to another embodiment.

FIG. 5 is an exemplary circuit diagram illustrating the equalizer 100 of FIG. 1 according to another embodiment.

Referring to FIG. 5, an inverting circuit 10b of an equalizer 100b includes an inverter 11. A delay circuit 20b includes at least one inverter IV1, a resistor R1, and a switch SW connected in parallel to the at least one inverter IV1. The switch SW may be implemented using a transmission gate operating in response to a select signal SEL and a sub-select signal SELB. Since the transmission gate and the sub-select signal SELB were described with reference to FIG. 2, repeated descriptions thereof are omitted.

The switch SW may be turned on or off in response to the select signal SEL and the sub-select signal SELB. When the select signal SEL is at a first logic level, for example, a low level, the switch SW is turned on, so that the input node and output node of at least one inverter IV1 are short and the input signal Vin is delayed by the resistor R1 and outputted. Therefore, the delay circuit 20b may output a delay signal. When the select signal SEL is at a second logic level, for example, a high level, the switch SW is turned off, and the input signal Vin is delayed by the resistor R1 and is inverted by the at least one inverter IV1, and then is outputted.

Therefore, the delay circuit 20b may output an inverted signal of the input signal Vin.

Figure 6:
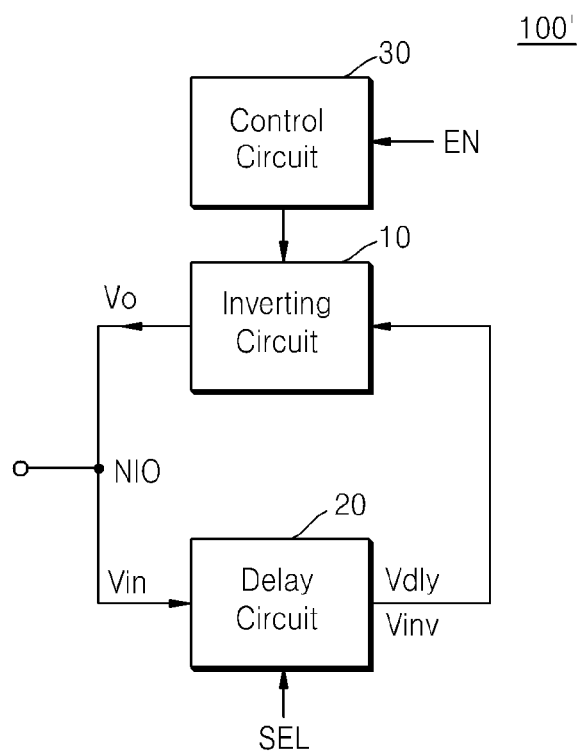
FIG. 6 is an exemplary block diagram of an equalizer according to another embodiment.

FIG. 6 is an exemplary block diagram of an equalizer 100' according to another embodiment.

Referring to FIG. 6, the equalizer 100' includes an inverting circuit 10, a delay circuit 20, and a control circuit 30.

Compared to the equalizer 100 of FIG. 1, the equalizer 100' of FIG. 6 may further include the control circuit 30 for controlling the inverting circuit 10 in response to an enable signal EN. For example, when the enable signal EN is at a first level, for example, a low level, the control circuit 30 controls the inverting circuit 10 not to output a signal. When the enable signal EN is at a second level, for example, a high level, the inverting circuit 10 operates normally, and a signal applied from the delay circuit 20 is inverted and outputted. Since the control circuit 30 controls an output of the inverting circuit 10, it may control the equalizer 100' to operate or not to operate. Since the inverting circuit 10 and the delay circuit 20 of the equalizer 100' are similar to those of the equalizer 100 of FIG. 1, repeated descriptions thereof are omitted.

Figure 7:
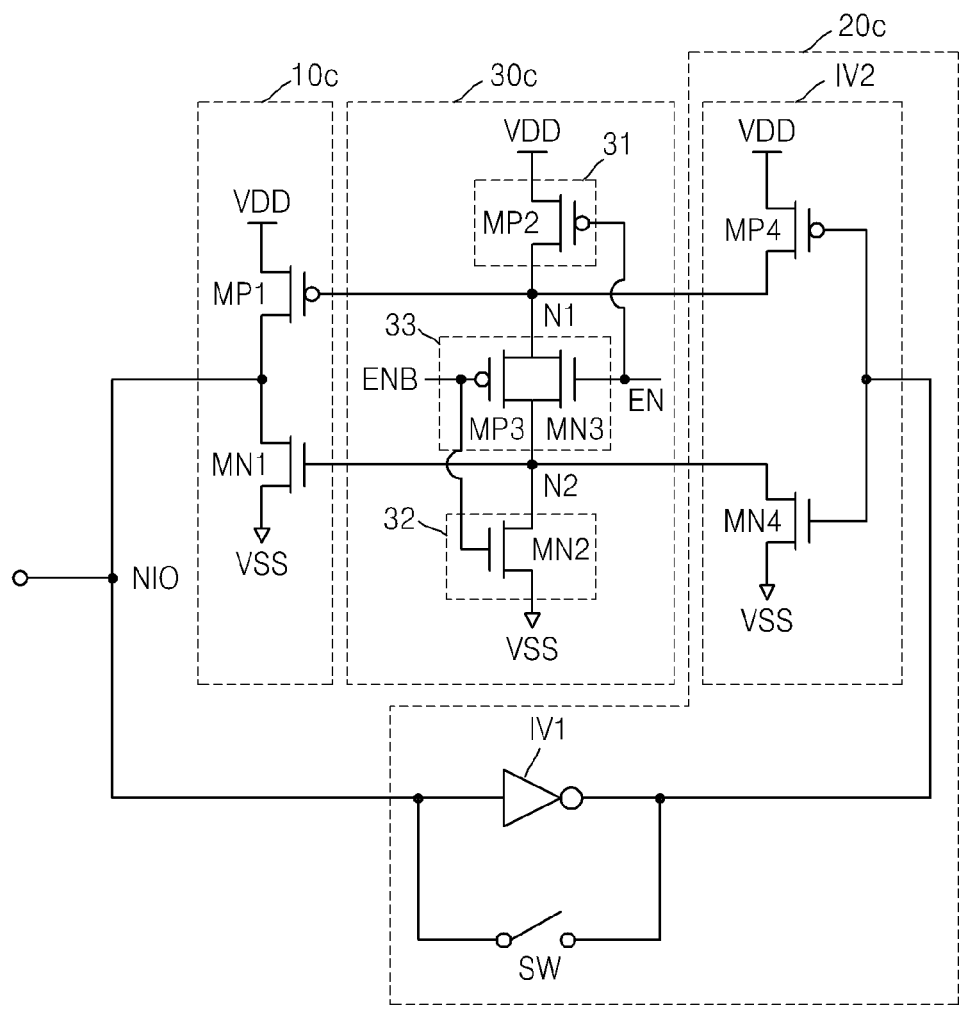
FIG. 7 is an exemplary circuit diagram illustrating the equalizer of FIG. 6 according to one embodiment.

FIG. 7 is an exemplary circuit diagram of the equalizer 100' of FIG. 6 according to one embodiment.

Referring to FIG. 7, an inverting circuit 10c may include a PMOS transistor MP1 operating by receiving a gate voltage from a first node N1 and an NMOS transistor MN1 operating by receiving a gate voltage from a second node N2. When a low level signal is applied to a gate of the PMOS transistor MP1, the PMOS transistor MP1 is turned on to output a high level signal, for example, a power voltage VDD. When a high level signal is applied to a gate of the NMOS transistor MN1, the NMOS transistor MN1 is turned on to output a low level signal, for example, a ground voltage VSS.

A delay circuit 20c may include a first inverter IV1, a second inverter IV2, and a switch SW connected in parallel to the first inverter IV1. The delay circuit 20c is similar to the delay circuit 20a of FIG. 3. However, when each of the PMOS transistor MP4 or the NMOS transistor MN4 in the second inverter IV2 is turned on, they may output signals to different nodes. For example, when a PMOS transistor MP4 is turned on an NMOS transistor MN4 is turned off as a low level signal is applied from the first inverter IV1, and the PMOS transistor MP4 may output a high level signal, for example, a power voltage VDD, to the first node N1. When the NMOS transistor MN4 is turned on the PMOS transistor MP4 is turned off as a high level signal is applied from the first inverter IV1, and the NMOS transistor MN4 may output a low level signal, for example, a ground voltage VSS, to the second node N2.

A control circuit 30c may include a pull-up device 31, a pull-down device 32, and a switch 33. The pull-up device 31 may be connected between a first voltage, for example, the power voltage VDD and the first node N1. The pull-down device 32 may be connected between a second voltage, for example, the ground voltage VDD and the second node N2. The pull-up device 31 may be a PMOS transistor MP2 operating in response to an enable signal EN, and the pull-down device 32 may be the NMOS transistor MN2 operating in response to a sub-enable signal ENB. At this point, the sub-enable signal ENB may have an opposite level to the enable signal EN. The sub-enable signal ENB may be applied from the outside together with the enable signal EN or the sub-enable signal ENB may be generated by inverting the enable signal EN.

The switch 33 may be connected between the first node N1 and the second node N2 and may be a transmission gate in which a PMOS transistor MP3 and an NMOS transistor MN3 are connected in parallel to each other. The PMOS transistor MP3 may operate in response to the sub-enable signal ENB, and the NMOS transistor MN3 may operate in response to the enable signal EN.

When the enable signal EN is at a second level, for example, a high level, the switch 33 may be turned on, and the first node N1 and the second node N2 may have the same voltage. Accordingly, as one of the NMOS transistor MN1 and the PMOS transistor MP1 of the inverting circuit 10c is turned on, a signal having a level opposite to a logic level of the first node N1 and the second node N2 may be outputted.

When the enable signal EN is at a first level, for example, a low level, the switch 33 may be turned off and the pull-up device 31 and the pull-down device 32 may be turned on. Accordingly, when the power voltage VDD is applied to the first node N1 and the ground voltage VSS is applied to the second node N2, the PMOS transistor MP1 and the NMOS transistor MN1 of the inverting circuit 10c may be both turned off. Accordingly, the inverting circuit 10c has a high impedance state, and outputs no signal. Thus, the equalizer 100c may be deactivated when the enable signal EN is at the low level.

Figure 8:
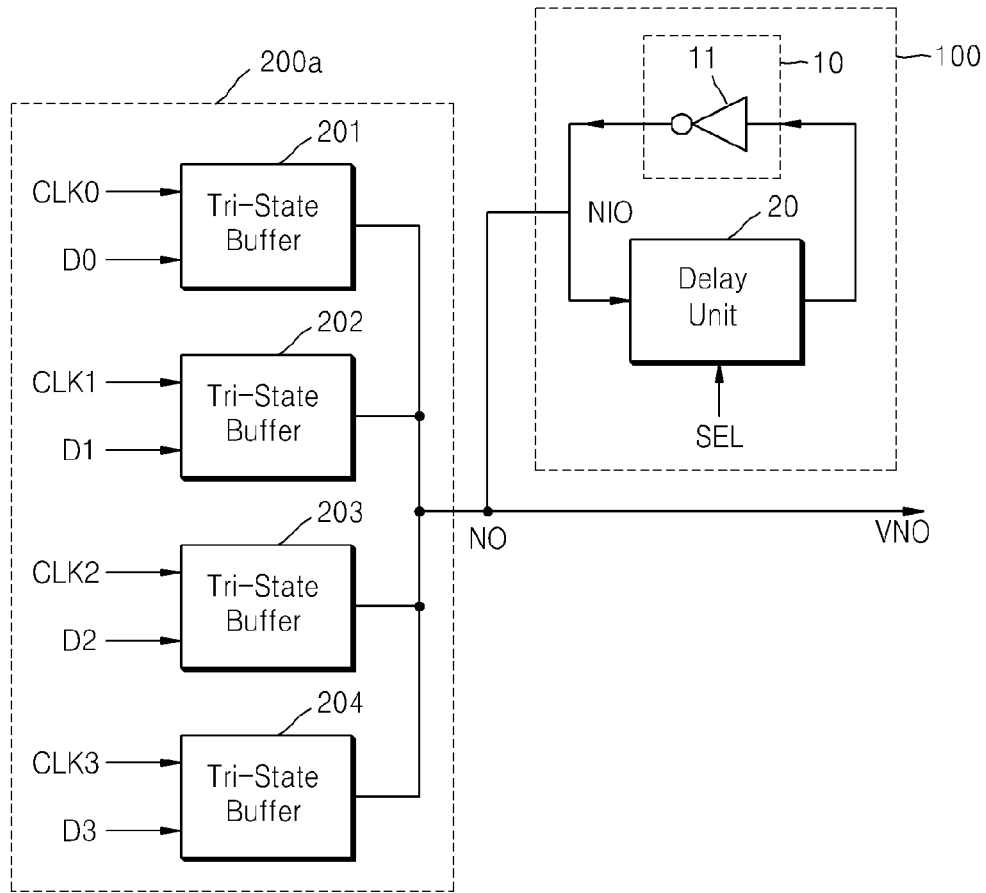
FIG. 8 is an exemplary block diagram illustrating the equalizer of FIG. 1 and a multiplexer according to one embodiment.

FIG. 8 is an exemplary block diagram illustrating the equalizer 100 of FIG. 1 and a multiplexer 200a according to one embodiment.

In one embodiment, the multiplexer 200a may be connected to the output node of the semiconductor memory device, such as DRAM or flash memory. In another embodiment, the multiplexer 200a may be connected to an internal node for driving an output driver of the semiconductor memory device. The multiplexer 200a may sequentially output data corresponding to data received from a core circuit, for example, a cell array of the semiconductor memory device, in order to output them to the outside, while operating at high speed.

Referring to FIG. 8, the multiplexer 200a may include a plurality of tri-state buffers 201, 202, 203, and 204, with output nodes of the tri-state buffers that are connected to each other. In this embodiment, four tri-state buffers 201, 202, 203, and 204 are shown but the present disclosure is not limited thereto.

Figure 9:
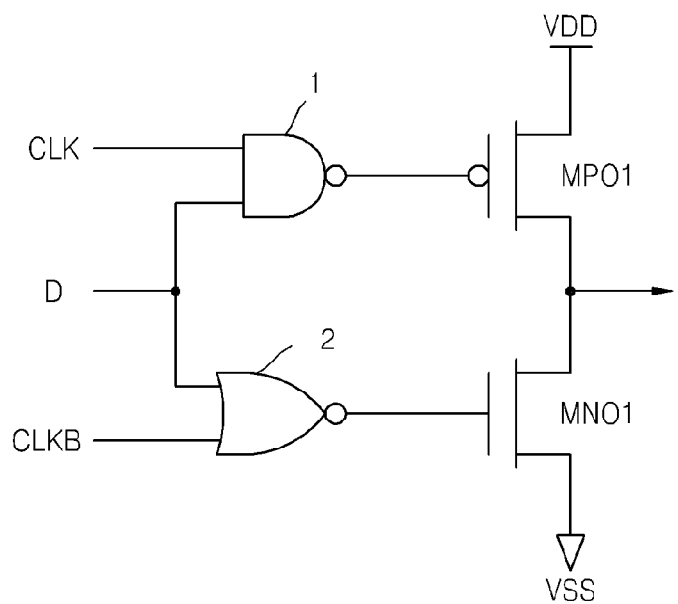
FIG. 9 is an exemplary circuit diagram illustrating a tri-state buffer.

The four tri-state buffers 201, 202, 203, and 204 may be each implemented as shown in FIG. 9, for example. Referring to FIG. 9, a tri-state buffer may include a NAND gate 1 to which a clock signal CLK and a data signal D are applied, a NOR gate 2 to which the data signal D and a sub-clock signal CLKB are applied, and a PMOS transistor MPO1 and an NMOS transistor MNO1 operating as an inverter by receiving the outputs of the NAND and NOR gates 1 and 2.

When the clock signal CLK is at a low level, the NAND gate 1 may output a high level signal, and when the clock signal CLK is at a high level, the NAND gate 1 may output a signal having an opposite level to the data signal D. When the sub-clock signal CLKB is at a high level, the NOR gate 2 may output a low level signal, and when the sub-clock signal CLKB is at a low level, the NOR gate 2 may output a signal having an opposite level to the data signal D. Accordingly, when the clock signal CLK is at a low level, a high level signal is applied to the PMOS transistor MPO1, and a low level signal is applied to the NMOS transistor MNO1, so that the two transistors MPO1 and MNO1 are both turned off and a tri-state buffer enters a high impedance state. On the contrary, if the clock signal CLK is at a high level, a signal having an opposite level to the data signal D is applied to the PMOS transistor MPO1 and the NMOS transistor MNO1, and as the PMOS transistor MPO1 and the NMOS transistor MNO1 operate as an inverter, a signal having the same level as the data signal may be outputted.

Referring to FIG. 8 again, the tri-state buffers 201, 202, 203, and 204 may operate by receiving clock signals CLK0 to CLK3 and data signals D0 to D3, respectively. For example, the clock signals CLK0 to CLK3 may have different phases. The tri-state buffers 201 to 204 may sequentially output the applied data signals D0 to D3 in response to the rising/falling edges or low/high levels of the applied clock signals CLK0 to CLK3. For example, when the tri-state buffers 201 to 204 are implemented with the circuit of FIG. 9, the data signals D0 to D3 are outputted if the clock signals CLK0 to CLK3 are at a high level. The clock signals CLK0 to CLK3 sequentially reach a high level, and their timings do not overlap each other. Accordingly, the data signals D0 to D3 are sequentially outputted. At this point, when the applied clock signals CLK0 to CLK3 are at a low level, the tri-state buffers 201 to 204 may have a high impedance state.

Moreover, when one tri-state buffer outputs a data signal, since the other tri-state buffers have a high impedance state, the load of the output node NO becomes larger, and due to this, when the multiplexer 200a operates at high speed, ISI may occur. Additionally, when all the tri-state buffers 201 to 204 have a high impedance state, the output node NO of the multiplexer 200a may float. As described with reference to FIGS. 1 to 5, the equalizer 100 may operate as an inductive bias circuit or a latch circuit in response to the select signal SEL. Therefore, after the equalizer 100 is connected to the output node NO of the multiplexer 200a, the select signal SEL may be set to allow the equalizer 100 to operate as an inductive bias circuit or a latch circuit depending on an operating speed of the multiplexer 200a. When the multiplexer 200a operates at a speed of, for example, more than several giga bit per second (Gbps), since the equalizer 100 operates as an inductive bias circuit, ISI may be prevented. Furthermore, when the multiplexer 200a is in an idle state, since the equalizer 100 operates as a latch circuit, the output node NO does not float.

Figure 10:
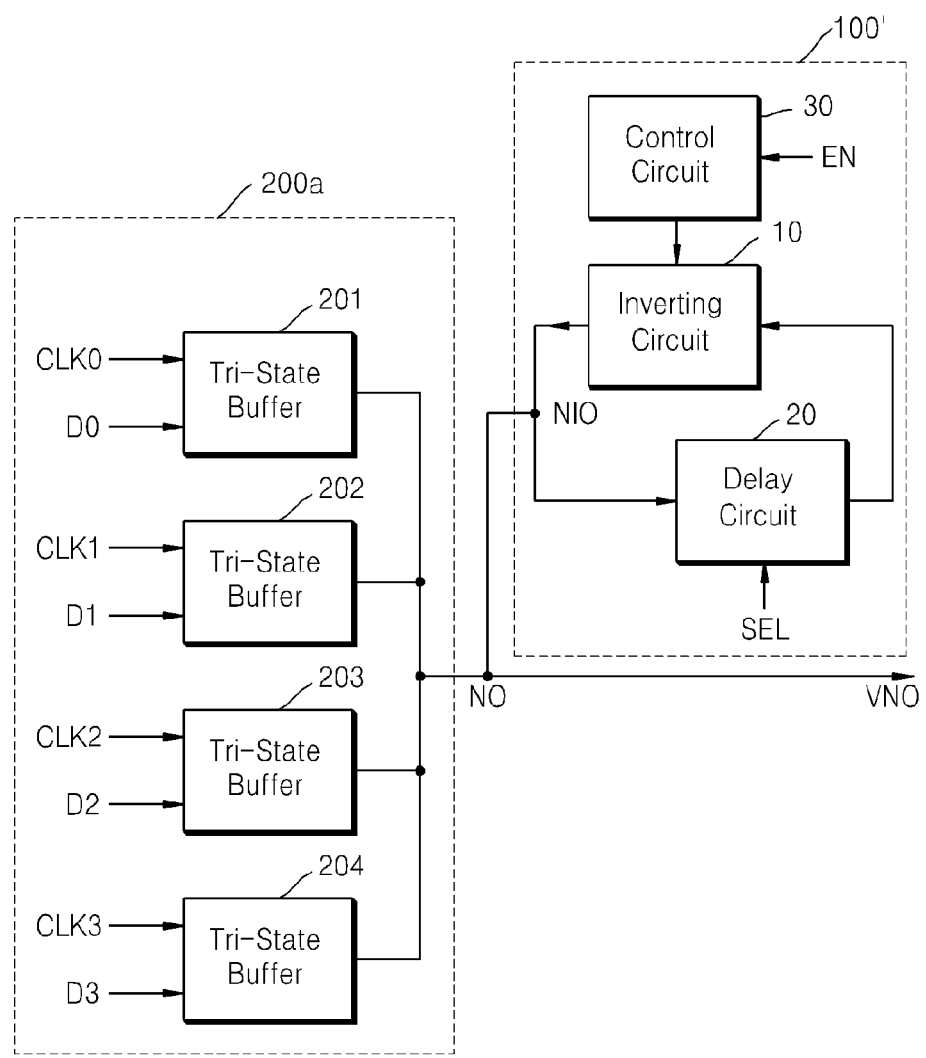
FIG. 10 is an exemplary block diagram illustrating the equalizer of FIG. 6 and a multiplexer according to one embodiment.

FIG. 10 is an exemplary block diagram illustrating the equalizer 100' of FIG. 6 and a multiplexer 200a according to one embodiment. As described with reference to FIG. 6, the equalizer 100' may operate or may not operate according to an enable signal EN, and may operate as an inductive bias circuit or a latch circuit according to a select signal SEL. Therefore, the equalizer 100' may operate by setting the enable signal EN and the select signal SEL according to an operating state and operating speed of the multiplexer 200a, as shown in Table 1.

TABLE 1

| Operating State | Speed | EN | SEL |
|---|---|---|---|
| Normal | Low | L | L or H |
|  | High | H | L |
| Idle | — | H | H |

Referring to Table 1, when an operating speed of the multiplexer 200a is a low speed of less than several Gbps, for example, less than 2 Gbps, the enable signal EN may be set to a low level not to operate the equalizer 100'. When an operating speed of the multiplexer 200a is a high speed of more than several Gbps, for example, more than 2 Gbps, by setting the enable signal EN to a high level and the select signal SEL to a low level, the equalizer 100' operates as an inductive bias circuit, so that ISI in an output signal of the multiplexer 200a may be prevented. Additionally, when the multiplexer 200a is in an idle state (e.g., a stand-by state), by setting the enable signal EN and the select signal SEL to a high level, the equalizer 100' operates as a latch circuit, so that the output node NO of the multiplexer 200a may not float. Accordingly, when the multiplexer 200a operates at high speed or is in an idle state, a signal that the multiplexer 200a requires may be outputted stably by operating the equalizer 100', and when the multiplexer 200a operates a low speed, power consumption may be reduced by not operating the equalizer 100'.

Figure 11:
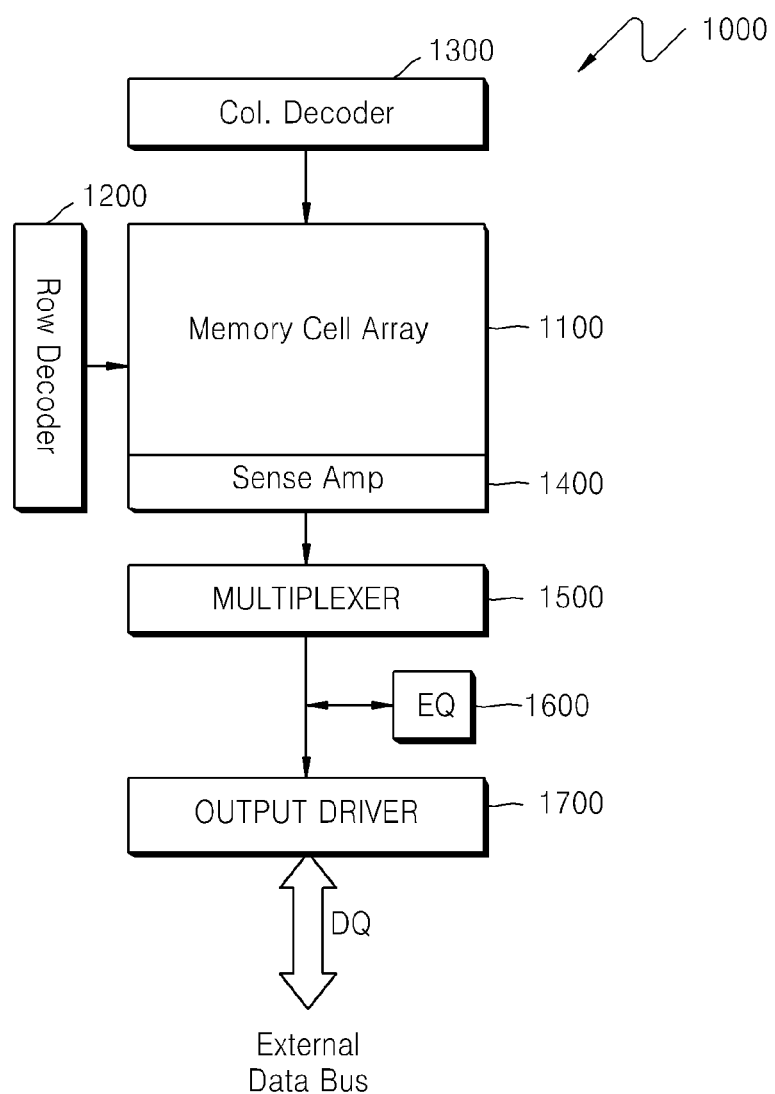
FIG. 11 is an exemplary block diagram illustrating a semiconductor memory device according to certain embodiments.

FIG. 11 is an exemplary view illustrating a semiconductor memory device 1000 according to certain embodiments. Referring to FIG. 11, the semiconductor memory device 1000 includes a memory cell array 1100, a row decoder 1200 for driving the rows of the memory cell array 1100, a column decoder for driving the columns of the cell array 1100, and a sense amp 1400 for sensing and amplifying data. Additionally, the semiconductor memory device 1000 may include a multiplexer 1500, an equalizer 1600, and an output driver 1700 to output data from the cell array 1100 to outside the semiconductor memory device 1000.

The memory cell array 1100 includes memory cells for storing data. A memory cell may include a volatile memory cell such as Dynamic RAM (DRAM) and Static RAM (SRAM) or a nonvolatile memory cell such as Magnetic RAM (MRAM), Ferroelectric RAM (FeRAM), Phase Change RAM (PRAM), Flash, Resistive Random Access Memory (RRAM), and Anti-fuse Array.

The row decoder 1200 decodes a row address signal or a refresh address signal and activates a word line of the memory cell array 1100. The column decoder 1300 decodes a column address signal and performs a selection operation on a bit line of the memory cell array 1100. The sense amp 1400 amplifies the data of a memory cell selected by the row decoder 1200 and the column decoder 1300, and provides the amplified data to the multiplexer 1500 including a plurality of tri-state buffers. The multiplexer 1500 may sequentially output pieces of data corresponding to data applied in parallel from the sense amp 1400 and provide them to the output driver 1700. The output driver 1700 outputs data signals through an external data bus. The equalizer 1600 may be connected between the output node of the multiplexer 1500 and an input node of the output driver 1700. The equalizer 1600 may be one described with reference to FIGS. 1 and 6. The equalizer 1600 operates as a latch circuit or an inductive bias circuit according to an operating state or operating speed of the multiplexer 1500, so that the multiplexer 1500 may stably and accurately provide data to the output driver 1700.

Figure 12:
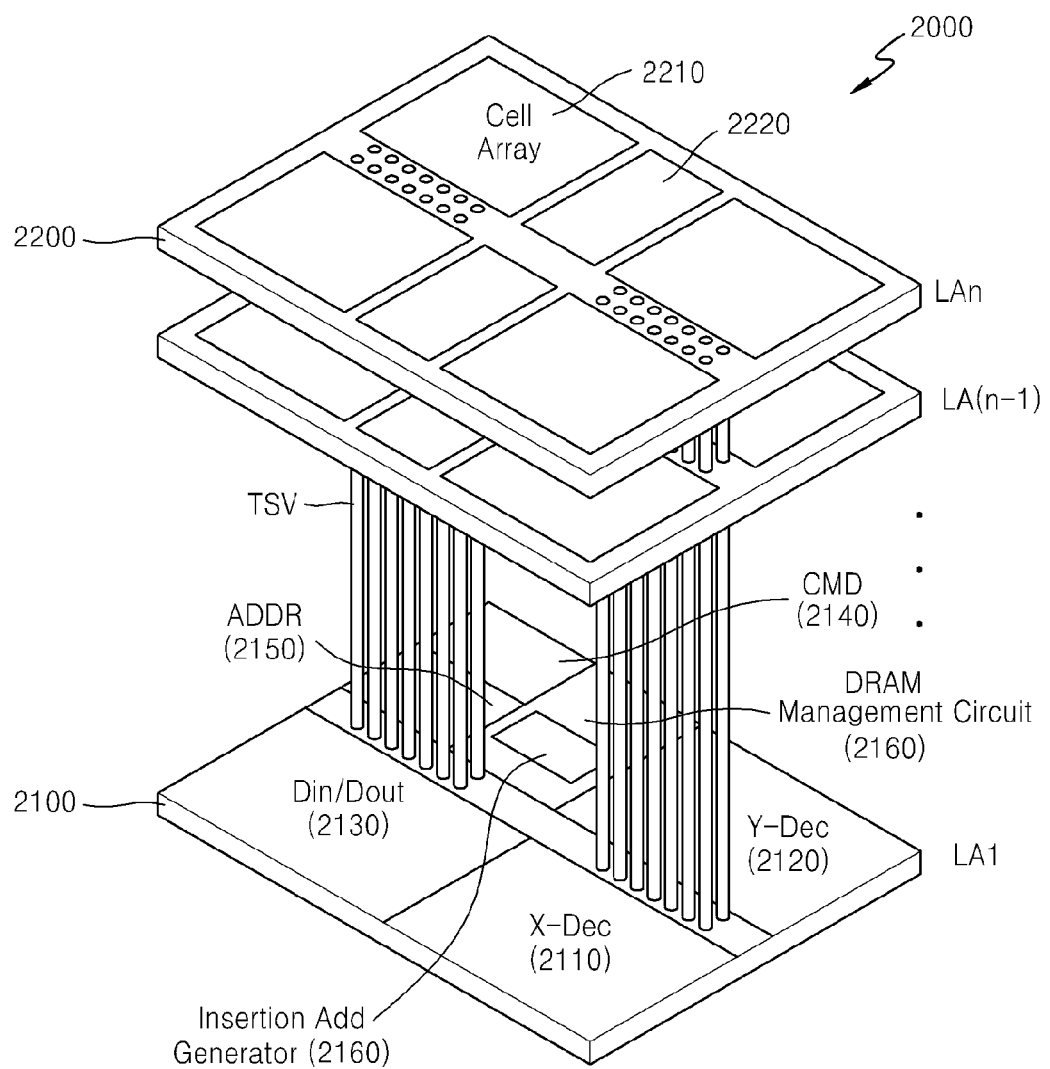
FIG. 12 is an exemplary view illustrating a structure of a semiconductor memory device according to certain embodiments.

FIG. 12 is an exemplary view illustrating a structure of a semiconductor memory device 2000 according to certain embodiments. As shown in FIG. 12, the semiconductor memory device 2000 according to disclosed embodiments may include a plurality of semiconductor layers LA1 to LAn. Each of the semiconductor layers LA1 to LAn may be a memory chip including a volatile memory cell or nonvolatile memory cell. Some of the semiconductor layers LA1 to LAn may be master chips for interfacing with an external controller and the others may be slave chips for storing data. Referring to FIG. 12, it will be assumed that the lowermost semiconductor layer LA1 is a master chip and the other semiconductor layers LA2 to LAn are slave chips. Additionally, it is assumed that a memory chip includes a DRAM cell.

The plurality of semiconductor layers LA1 to LAn may transmit/receive signals through a through substrate via (TSV, e.g., through silicon via), and the master chip LA1 may communicate with an external memory controller (not shown) through a conductive means (not shown) formed at the outer side. A configuration and operation of the semiconductor memory device 2000 will be described on the basis of a first semiconductor layer 2100 as a master chip and an nth semiconductor layer as a slave chip, as follows:

The first semiconductor layer 2100 may include various circuits for driving a memory cell array 2210 in slave chips. For example, the first semiconductor layer 2100 may include a row decoder X-Dec 2110 for driving a word line of the memory cell array 2210, a column decoder Y-Dec 2120 for driving a bit line, a data input/output circuit 2130 for controlling the input/output of data, a command buffer 2140 receiving a command CMD from the outside, an address buffer 2150 for receiving an address from the outside and storing it, and a DRAM management circuit 2160 for managing a memory operation of a slave chip. The output terminal of the data input/output circuit 2130 may include an equalizer between a multiplexer and an output driver to serialize data from the memory cell array 2210 and output the data. Accordingly, a semiconductor memory device operates stably, and outputs the data stored in the memory cell array 2210 fast and accurately.

Moreover, the nth semiconductor layer 2200 may include a memory cell array 2210 and a peripheral circuit area 2220. The peripheral circuit area 2220 includes other peripheral circuits for driving a cell array, for example, a row/column selection circuit for selecting a row and column of the memory cell array 2210 and a sense amp (not shown).

Figure 13:
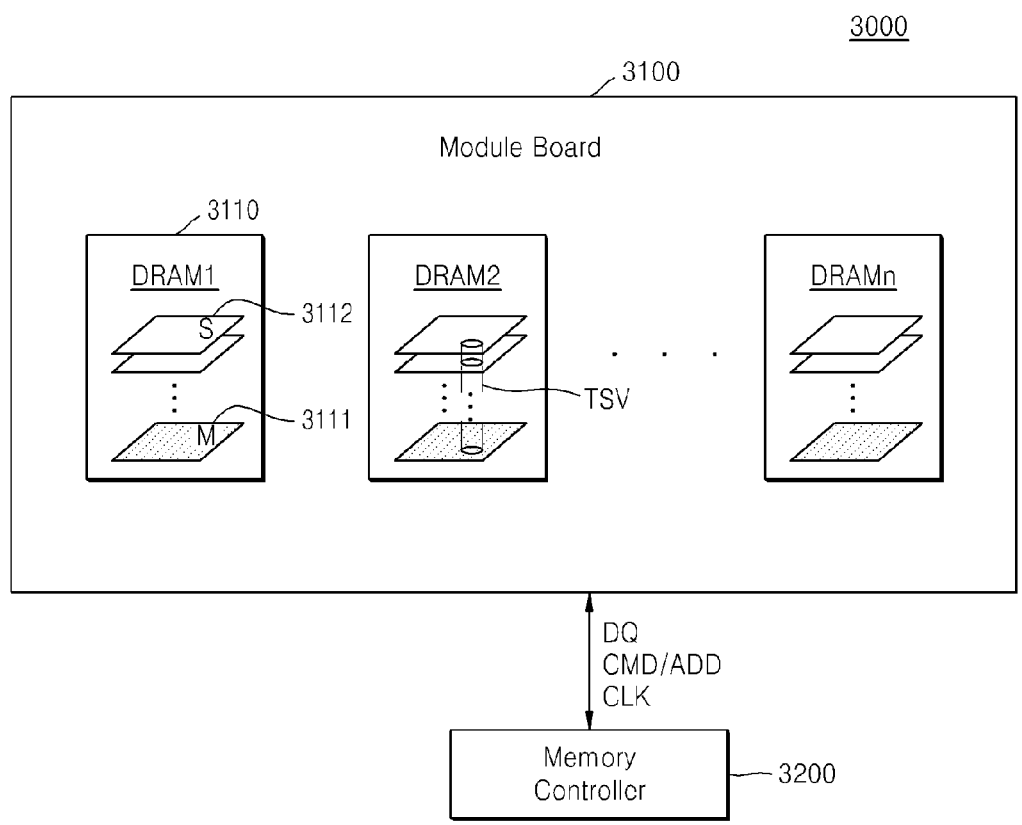
FIG. 13 is an exemplary view illustrating a memory system including a semiconductor memory device, according to embodiments.

FIG. 13 is an exemplary view illustrating a memory system 3000 including a semiconductor memory device, according to certain embodiments.

Referring to FIG. 13, the memory system 3000 may include a memory module 3100 and a memory controller 3200. The memory module 3100 may include at least one semiconductor memory device 3110 according to disclosed embodiments and mounted on a module board. The semiconductor memory device 3110 may be implemented with a DRAM chip. However, it is just one example and the present invention is not limited thereto. The semiconductor memory device 3100 may be implemented with an MRAM chip, an RRAM chip, a PRAM chip, an anti-fuse array chip, and a flash memory chip. Each semiconductor memory device 3100 may include a plurality of semiconductor layers. The semiconductor layers may include at least one master chip 3111 and at least one slave chip 3112. Signal transmission between the semiconductor layers may be performed through a TSV.

In this embodiment, although the structure in which signal transmission between the semiconductor layers may be performed through a TSV is described, the present disclosure is not limited thereto. That is, an embodiment may have a structure in which layers are stacked through wire bonding, interposing, or a tape having wiring.

Additionally, signal transmission between semiconductor layers may be performed through optical IO connection. For example, a radiative method using radio frequency (RF) waves or ultrasonic waves, an inductive coupling method using magnetic induction, or a non-radiative method using magnetic resonance may be used for connection.

The radiative method delivers signals wirelessly through an antenna, such as a monopole or a planar inverted-F antenna (PIFA). While magnetic and magnetic fields changing over time affect each other, radiation occurs, and if there are antennas having the same frequency, signals are received according to the polarization characteristics of incident waves. The inductive coupling method generates a strong magnetic field in one direction by winding a coil several times, and generates coupling by putting coils, which resonate at a similar frequency, close to each other. The non-radiative method uses evanescent wave coupling, which moves electromagnetic waves between two media resonating at the same frequency through a short-range electromagnetic field.

The memory module 3100 may communicate with the memory controller 3200 through a system bus. Data DQ, a command/address CMD/ADD, and a clock signal CLK may be transmitted and received between the memory module 3100 and the memory controller 3200 through the system bus.

Figure 14:
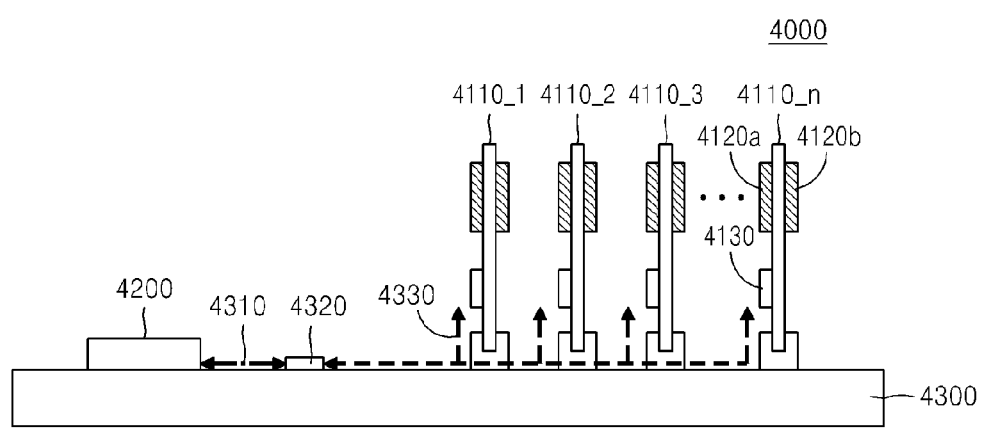
FIG. 14 is an exemplary view illustrating a structure of a server system including a semiconductor memory device, according to certain embodiments.

FIG. 14 is an exemplary view illustrating a structure of a server system 4000 including a semiconductor memory device, according to certain embodiments.

The server system 4000 includes a memory controller 4200 and a plurality of memory modules 4110_1 to 4110_n. Each of the plurality of memory modules 4110_1 to 4110_n may include memory blocks 4120a and 4120b consisting of a plurality of memory chips. For example, the memory chips constituting the memory blocks 4120a and 4120b may include volatile or nonvolatile memory chips. The memory chips may include a DRAM chip, an SRAM chip, an MRAM, an RRAM chip, a PRAM chip, an anti-fuse array chip, and a flash memory chip. One of the memory chips may be a semiconductor memory device according to disclosed embodiments. Accordingly, the memory chips operate stably and output stored data fast and accurately.

As shown in FIG. 14, the server system 4000 has a single channel structure in which the memory controller 4200 and the plurality of memory modules 4110_1 to 4110_n are mounted on the same circuit substrate 4300. However, this is just one example, and the present invention is not limited thereto. The server system 4000 may be designed with various structures, such as a multichannel structure in which sub substrates having a plurality of memory modules mounted are respectively coupled to sockets of a main substrate having the memory controller 4200 mounted.

Additionally, signal transmission between the plurality of memory modules 4110_1 to 4110_n may be performed through an optical IO connection. The server system 4000 may further include an electro-optical conversion unit 4320 and each of the memory modules 4110_1 to 4110_n may further include an optical-electro conversion unit 4130. Additionally, according to another embodiment, the electro-optical conversion unit 4320 may be built in the memory controller 4200.

The memory controller 4200 accesses the electro-optical conversion unit 4320 through an electrical channel 4310. Accordingly, the memory controller 4200 exchanges signals with the electro-optical conversion unit 4320 through the electrical channel 4310.

The electro-optical conversion unit 4320 converts an electrical signal received from the memory controller 4200 into an optical signal, and then, transmits the optical signal through an optical channel 4330, and also converts an optical signal received through the optical channel 4330 into an electrical signal and then, transmits the electrical signal through the electrical channel 4310.

The memory modules 4110_1 to 4110_n access the electro-optical conversion unit 4320 through the optical channel 4330. An optical signal transmitted through the optical channel 4330 is applied to the optical-electro conversion unit 4130 in each of the memory modules 4110_1 to 4110_n. The optical-electro conversion unit 4130 converts an optical signal into an electrical signal and transmits the electrical signal to each of the memory blocks 4120a and 4120b. Additionally, electrical signals generated from each of the memory blocks 4120a and 4120b are converted into optical signals by the optical-electro conversion unit 4130 and then outputted.

As mentioned above, in the server system 4000, signal transmission between the memory controller 4200 and the plurality of memory modules 4110_1 to 4110_n is performed through an optical IO method.

Figure 15:
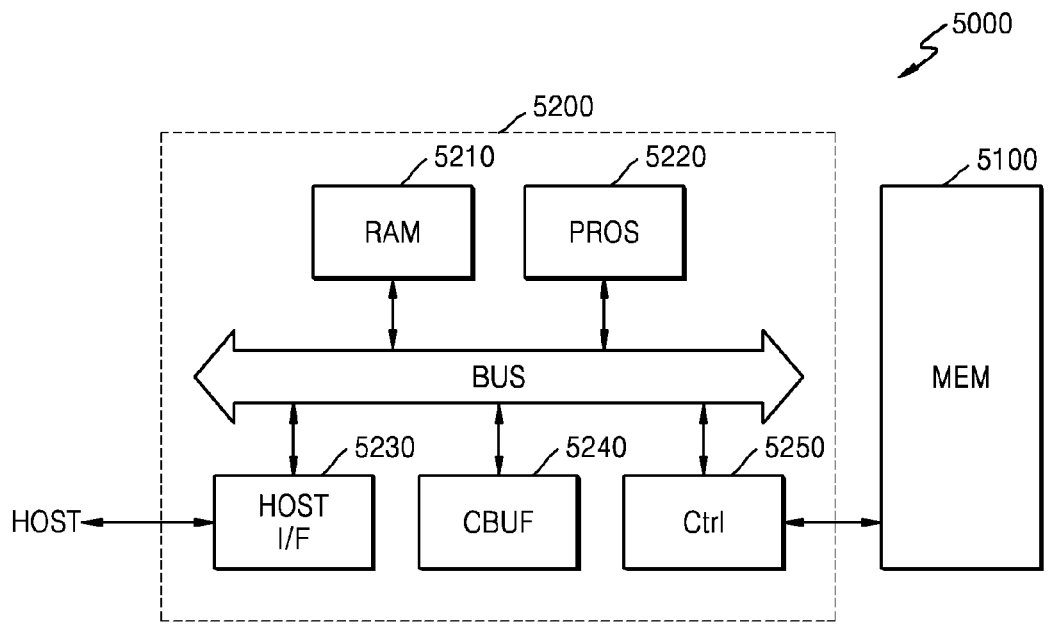
FIG. 15 is an exemplary view illustrating a semiconductor memory system including an SSD as a semiconductor memory device, according to certain embodiments.

FIG. 15 is an exemplary view illustrating a semiconductor memory system 5000 including a semiconductor memory device according to certain embodiments. The semiconductor memory system 5000 includes a solid state drive as the semiconductor memory device.

Referring to FIG. 15, the SSD includes an SSD controller 5200 and a memory device 5100. The memory device 5100 may be a semiconductor memory device according to disclosed embodiments. Accordingly, data stored in the memory device 5100 may be outputted to the SSD controller 5200 fast and accurately according to a command of the SSD controller 5200.

The SSD controller 5200 may include a processor 5200, RAM 5210, a host interface 5230, a cache buffer 5240, and a memory controller 5250, which are connected via a bus BUS. The processor 5220 controls the memory controller 5250 to transmit/receive data to/from the memory device 5100 in response to a request (for example, a command, an address, or data) of a host HOST. The processor 5220 and the memory controller 5250 of the SSD may be implemented with one ARM processor. Data necessary for an operation of the processor 5220 may be loaded into the RAM 5210.

The host interface 5230 receives a request of the host HOST and transmits it to the processor 5220, or transmits data transmitted from the memory device 5100 to the host HOST. The data that is to be transmitted to the memory device 5100 or transmitted from the memory device 5100 may be temporarily stored in the cache buffer 5240. The cache buffer 5240 may be SRAM.

The above-mentioned semiconductor memory device may be mounted through various forms of packages. For example, the semiconductor memory devices may be mounted through packages such as, for example, Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 16:
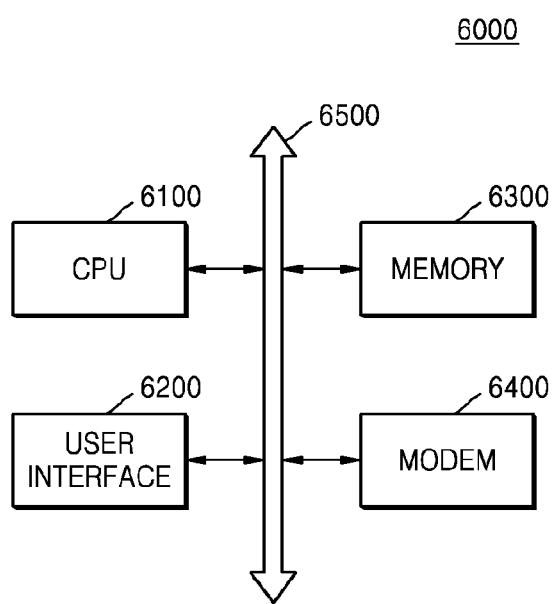
FIG. 16 is an exemplary view illustrating a computer system including a semiconductor memory device, according to certain embodiments.

FIG. 16 is an exemplary view illustrating a computer system 6000 including a semiconductor memory device, according to certain embodiments.

Referring to FIG. 16, the computer system 6000 may include a central processing unit 6100, a user interface 6200, a memory 6300, and a modem 6400 such as a baseband chipset, which are connected via a system bus 6500. The user interface 6200 may be an interface for transmitting data to a communication network or receiving data from a communication network. The user interface 6200 may be a wire/wireless form, and may include an antenna or a wire/wireless transceiver. The data provided through the user interface 6200 or the modem 6400 or processed by the central processing unit 6100 may be stored in the memory 6300.

The memory 6300 may include a volatile memory device, such as DRAM, and/or a nonvolatile memory device, such as flash memory. The memory 6300 may be a semiconductor memory device according to disclosed embodiments. Accordingly, an equalizer provided between a multiplexer of a data output node and an output driver may allow the multiplexer to output accurate and stable data to the output driver. Accordingly, data stored in the memory 6300 may be outputted accurately and fast.

When the computer system 6000 is a mobile device, a battery is additionally provided in order to supply an operating voltage of the computer system 6000. Although not shown in the drawings, the computer system 6000 may further include an application chipset, a camera image processor (CIP), and an input/output device When the computer system 6000 is a device for performing wireless communication, it may be used for a communication system, such as Code Division Multiple Access (CDMA), Global System for Mobile communication (GSM), North American Multiple Access (NADC), and CDMA2000.

While the embodiments has been particularly shown and described with reference to exemplary embodiments thereof, it will be understood that various changes in form and details may be made therein without departing from the spirit and scope of the following claims.

What is claimed is:

1. A memory device comprising:
   a first driver circuit configured to output one or more output signals on an output node of the first driver circuit or float the output node based on one or more first driver select signals; and
   a second driver circuit configured to amplify or store the one or more output signals in response to a second driver select signal,
   wherein the second driver circuit includes:
   a first circuit including an input node connected to the output node of the first driver circuit, the first circuit configured to selectively output a delay signal delaying a first output signal of the one or more output signals applied to the input node of the first circuit or an inverted signal inverting the first output signal of the one or more output signals in response to the second driver select signal, and
   a second circuit including an input node connected to an output node of the first circuit and an output node connected to the output node of the first driver circuit, the second circuit configured to invert an output signal of the first circuit.

2. The memory device of claim 1, wherein the first driver circuit includes a plurality of buffers configured to sequentially output the output signals on the output node of the first driver circuit, and
   wherein each of the plurality of buffers is configured to connect the output node of the first driver circuit.

3. The memory device of claim 1, wherein the first circuit includes:
   at least a first inverter and a switch circuit connected in parallel with each other,
   wherein the switch circuit is configured to be turned on or turned off in response to the second driver select signal.

4. The memory device of claim 1, further comprising:
a control circuit configured to activate or deactivate the second circuit based on an enable signal,
wherein the second driver circuit is configured to deactivate when the second circuit is deactivated.

5. The memory device of claim 1, wherein the first driver circuit includes a multiplexer having a plurality of tri-state buffers and the multiplexer is configured to sequentially output the one or more output signals corresponding to a respective plurality of data signals applied in parallel to the plurality of tri-state buffers based on the one or more first driver select signals, and
wherein the second driver circuit is configured to operate as an inductive bias circuit amplifying the output signal of the multiplexer and outputting the amplified output signal, and to operate as a latch circuit storing and outputting the output signal of the multiplexer, in response to the second driver select signal.

6. The memory device of claim 5, wherein the first circuit comprises a delay circuit configured to output, in response to the second driver select signal, one of the delay signal and the inverted signal, and
wherein the second circuit comprises an inverting circuit coupled to the delay circuit and configured to invert the output signal provided from the delay circuit and output the inverted signal to the output node of the first driver circuit.

7. The memory device of claim 6, wherein the delay circuit comprises:
a plurality of inverters connected in series; and
a switch connected in parallel with at least one inverter among the plurality of inverters and configured to connect or disconnect input and output nodes of the at least one inverter in response to the second driver select signal.

8. The memory device of claim 6, wherein the delay circuit comprises a plurality of inverters connected in series, the delay circuit is configured to delay and output the output signal of the multiplexer by using an even number of inverters among the plurality of inverters when the second driver select signal is at a first level, and invert and output the output signal of the multiplexer by using an odd number of inverters among the plurality of inverters when the second driver select signal is at a second level opposite to the first level.

9. The memory device of claim 6, wherein the second driver circuit further comprises a control circuit configured to control an output of the inverting circuit in response to an enable signal.

10. The memory device of claim 9, wherein the inverting circuit includes a first transistor configured to drive a first voltage and a second transistor configured to drive a second voltage, and is configured to operate in response to an output signal of the delay circuit, and
wherein the control circuit is configured to control the first transistor and the second transistor to be turned off in response to the enable signal.

11. The memory device of claim 5, wherein the second driver circuit is configured to not operate when the multiplexer operates at less than a predetermined frequency, to operate as the inductive bias circuit when the multiplexer operates at more than a predetermined frequency, and to operate as the latch circuit when the multiplexer does not operate.

12. The memory device of claim 5, wherein the respective plurality of data signals are output in parallel from a dynamic random access memory (DRAM) cell array.

13. A memory device comprising:
a first driver configured to output an output signal on an output node of the first driver or float the output node; and
a second driver including a plurality of inverters connected in series and configured to, in response to a select signal, store the output signal of the first driver by using an even number of inverters among the plurality of inverters, and amplify the output signal of the first driver by using an odd number of inverters among the plurality of inverters; and
a switch connected in parallel with a first inverter among the plurality of inverters and configured to connect or disconnect input and output nodes of the first inverter in response to the select signal,
wherein an input node of the second driver is connected to the output node of the first driver and an output node of the second driver.

14. The memory device of claim 13, wherein the second driver is configured to not operate when the first driver operates at less than a predetermined frequency, to operate as an inductive bias circuit when the first driver operates at more than a predetermined frequency, and to operate as a latch circuit when the first driver does not operate.

15. The memory device of claim 13, wherein an output node of a second inverter among the plurality of inverters is connected to the output node of the first driver, and
wherein an on-resistance of the first driver is smaller than an on-resistance of the second inverter.

* * * * *